United States Patent [19]
Jokerst et al.

[11] Patent Number: 5,280,184
[45] Date of Patent: Jan. 18, 1994

[54] THREE DIMENSIONAL INTEGRATED CIRCUITS WITH LIFT-OFF

[75] Inventors: Nan M. Jokerst; Martin A. Brooke; Mark G. Allen, all of Atlanta, Ga.

[73] Assignee: Georgia Tech Research Corporation, Atlanta, Ga.

[21] Appl. No.: 865,379

[22] Filed: Apr. 8, 1992

[51] Int. Cl.$^5$ .............................. H01L 27/14
[52] U.S. Cl. ............... 257/82; 257/85; 257/98; 257/443; 257/84; 372/50; 437/915; 437/944
[58] Field of Search ........... 257/443, 444, 82, 84, 257/85, 98, 80, 74, 81, 919; 372/50, 11; 437/915, 944

[56] References Cited

U.S. PATENT DOCUMENTS

| | | | |
|---|---|---|---|
| 4,152,713 | 5/1979 | Copeland, III et al. | 257/85 |
| 4,667,212 | 5/1987 | Nakamura | 257/85 |
| 4,670,765 | 6/1987 | Nakamura et al. | 257/444 |
| 4,672,577 | 6/1987 | Hirose et al. | 257/443 X |
| 4,737,833 | 4/1988 | Tabei | 257/444 X |
| 4,899,204 | 2/1990 | Rosen et al. | 257/82 X |
| 5,093,879 | 3/1992 | Bregman et al. | 257/80 X |

FOREIGN PATENT DOCUMENTS

| | | | |
|---|---|---|---|
| 57-106181 | 7/1982 | Japan | 257/84 |
| 5929477 | 2/1984 | Japan | 257/80 |
| 2152749 | 8/1985 | United Kingdom | 257/80 |

Primary Examiner—William Mintel
Attorney, Agent, or Firm—Hopkins & Thomas

[57] ABSTRACT

Three dimensional communication within an integrated circuit occurs via electromagnetic communication between emitters and detectors situated throughout the integrated circuit. The emitters and detectors can be produced in a diode or laser configuration. The emitters and detectors can be fabricated via novel lift-off and alignable deposition processes. Integrated circuit layers, including silicon and gallium arsenide, are transparent to the electromagnetic signals propagated from the emitter and received by the detector. Furthermore, arrays of optical detectors can be implemented to perform image processing with tremendous speed. Processing circuitry can be situated directly below the optical detectors to process in massive parallel signals from individual optical detectors.

36 Claims, 6 Drawing Sheets

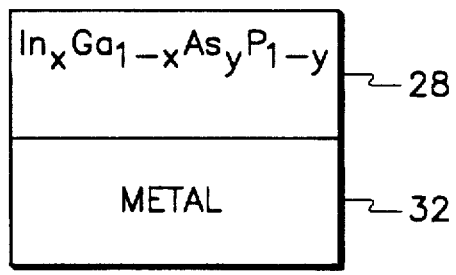
Fig. 2A
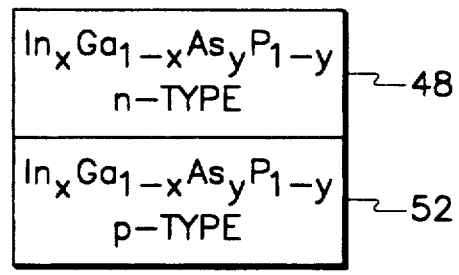
Fig. 2B
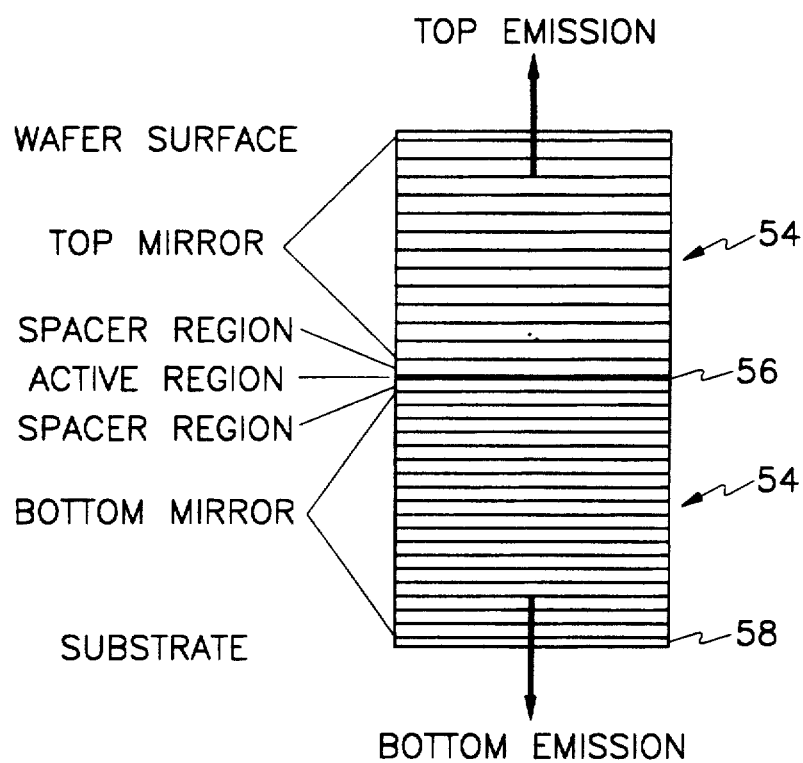
Fig. 2C
Fig. 2

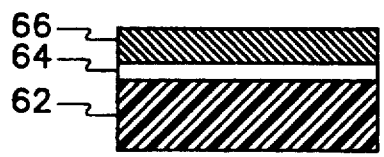
Fig. 3A
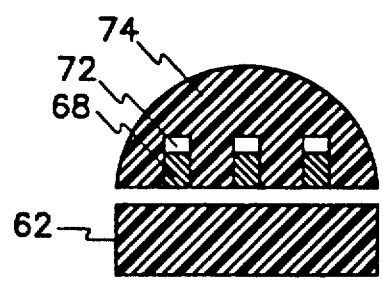
Fig. 3E
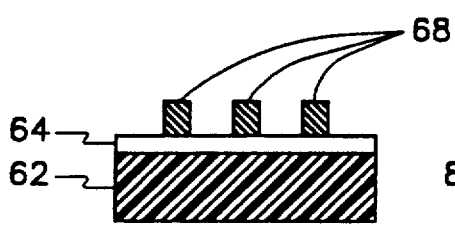
Fig. 3B
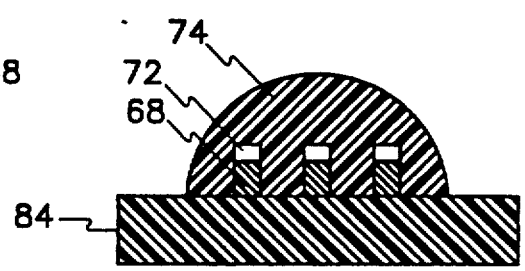
Fig. 3F
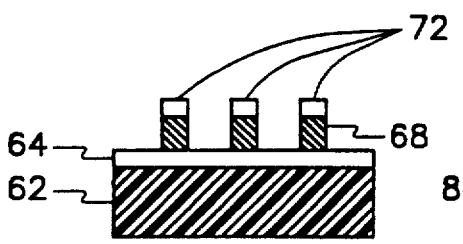
Fig. 3C
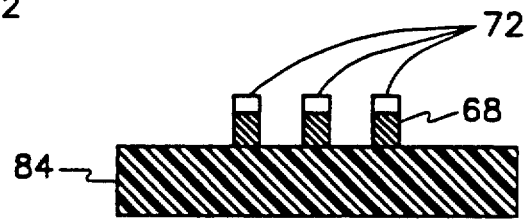
Fig. 3G
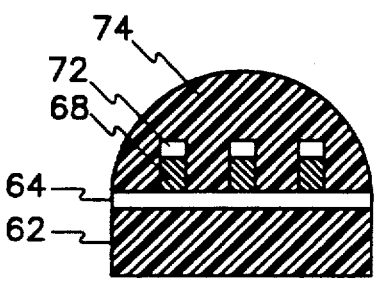
Fig. 3D
Fig. 3

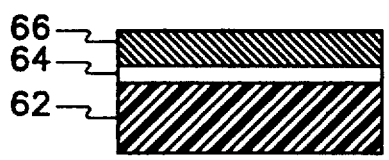
Fig. 4A
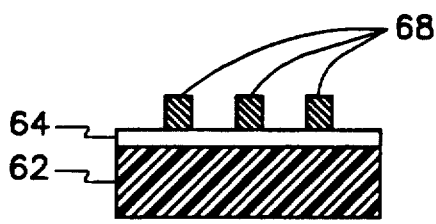
Fig. 4B
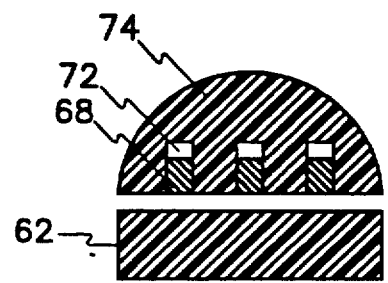
Fig. 4E
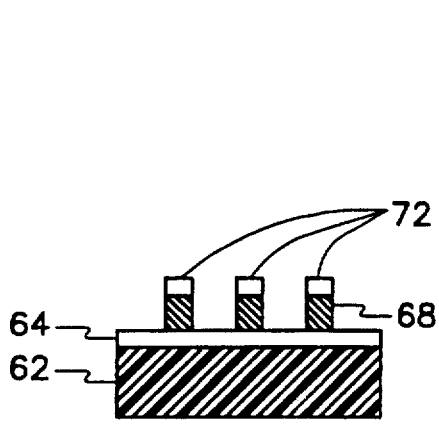
Fig. 4C
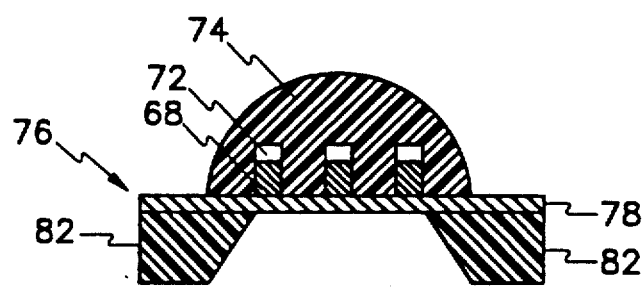
Fig. 4F
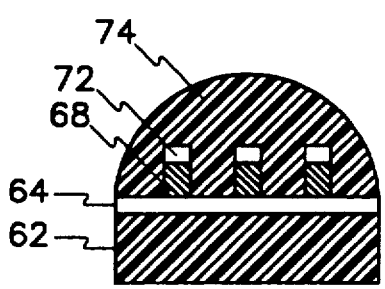
Fig. 4D
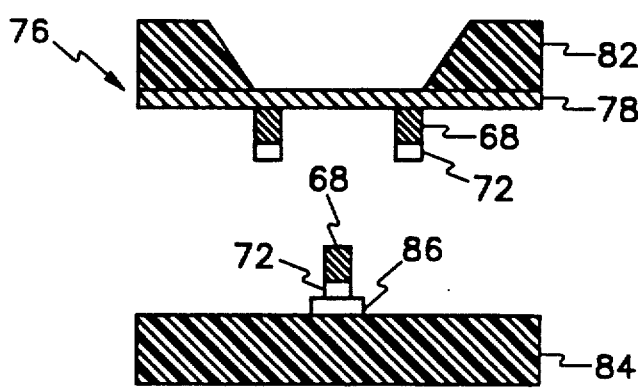
Fig. 4G
Fig. 4

Fig. 7A
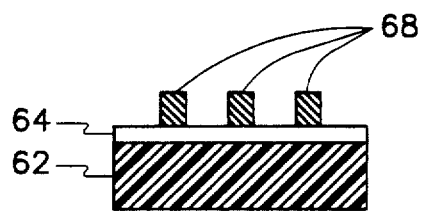
Fig. 7B
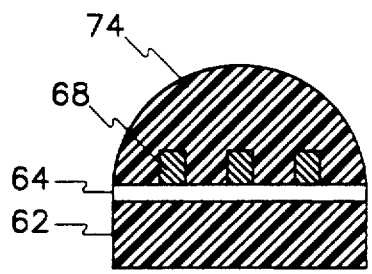
Fig. 7C
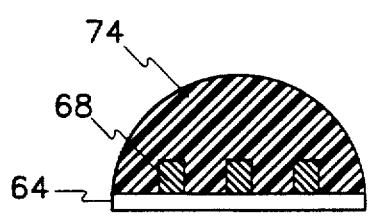
Fig. 7D
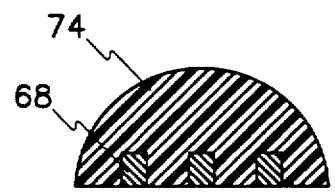
Fig. 7E
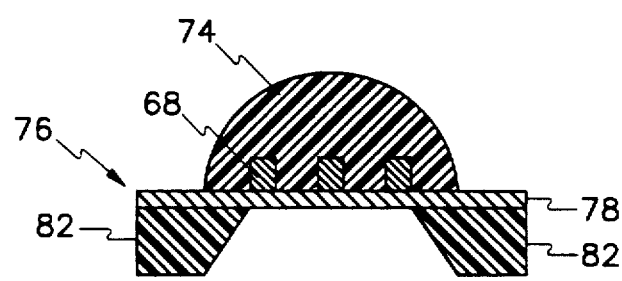
Fig. 7F
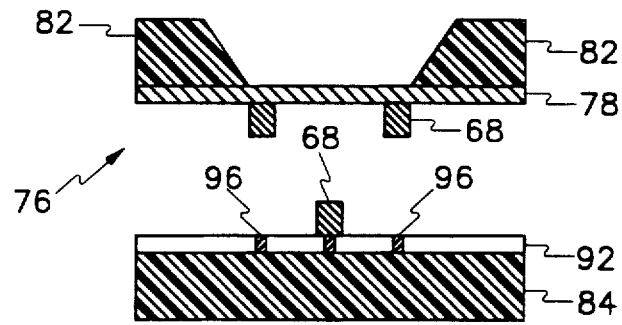
Fig. 7G
Fig. 7

THREE DIMENSIONAL INTEGRATED CIRCUITS WITH LIFT-OFF

The U.S. government has a paid-up license in this invention and the right in limited circumstances to require the patent owner to license others on reasonable terms as provided for by the terms of Contract Number ECS90-58-144 awarded by the National Science Foundation.

CROSS-REFERENCE TO RELATED APPLICATIONS

This patent application is related to the following copending patent applications, which are incorporated by reference as if set forth in full hereinbelow.

1. "Processes For Lift-Off Of Thin Film Materials And For The Fabrication Of Three Dimensional Integrated, Circuits", filed Apr. 8, 1992, having Ser. No. 07/865,126.

2. "Processes For Lift-Off And Deposition Of Thin Film Materials", filed Apr. 8, 1992, having Ser. No. 07/865,119.

FIELD OF THE INVENTION

The present invention generally relates to advanced integrated circuit technology, and more particularly, to implementing a massive three dimensional communication network in an integrated circuit cube by monolithically integrating thin film semiconductor emitters and/or detectors using novel separation, or "lift-off," and alignable deposition processes.

BACKGROUND OF THE INVENTION

The monolithic integration of gallium arsenide (GaAs) photonic and electronic materials and devices with host substrates, such as silicon (Si), glass, and polymers, will enable the fabrication of the next generation of integrated circuits, particularly, integrated circuit "cubes" having a massive three dimensional communication network and optoelectronic integrated circuits. A standard technique for GaAs on Si integration is heteroepitaxial growth, which is described in H. Choi J. Mattia, G. Turner, and B. Y. Tsauer, "Monolithic Integration of GaAs/AlGaAs LED and Si Driver Circuit", *IEEE Electron Dev. Lett.*, vol.9, pp. 512-514, 1988, incorporated herein by reference. However, the crystal quality of this heteroepitaxial material is often inadequate for many optical applications.

An integration method which seeks to preserve the high material quality of lattice-matched growth is the epitaxial lift-off process developed by Bell Communications Research, Inc., (Bellcore), as described in E. Yablonovitch, T. J. Gmitter, J. P. Harbison, and R. Bhat, "Double Heterostructure GaAs/AlGaAs Thin Film Diode Lasers on Glass Substrates", *IEEE Phot. Tech. Lett.*, 1, pp. 41-42, 1989, incorporated herein by reference. Essentially, a thin aluminum arsenide (AlAs) sacrificial layer is grown on a GaAs substrate, and then GaAs/AlGaAs device epitaxial layers are grown on top of the AlAs layer. The GaAs/AlGaAs lattice-matched epitaxial layers are separated from the growth substrate by selectively etching the AlAs sacrificial layer. These device layers are then mounted in a hybrid fashion onto a variety of host substrates. The device layers are of high quality and are currently being used for the integration of GaAs/AlGaAs materials onto host substrates, such as Si, glass, lithium niobate, and polymers.

However, although the Bellcore technique yields high quality material, it has several problems, including the inability to align and selectively deposit the devices. Moreover, there are difficulties in contacting both sides of the devices. Hence, at present, the Bellcore technique is inadequate for producing emitters and receivers for three dimensional integrated circuits, described in detail hereafter.

For an $n \times n$ array processor, the number of input/output (I/O) connections required for optimum performance is on the order of $n^2$. However, the number of connections available in a conventional two dimensional integrated circuit is typically on the order of $4 \times D$, as a result of space limitations thereby creating a connection bottleneck. Moreover, as the number of processing elements increases, connection availability becomes even more limited. Thus, the connection bottleneck substantially limits the processing density and speed of array processors implemented with integrated circuit technology.

The connection bottleneck can be overcome through the use of three dimensional communication at the I/O interface and within the integrated circuit itself. I/O connections can be implemented around the entire outside of the integrated circuit, including the top and bottom as well as the sides. Furthermore, intercommunication between integrated circuit layers as well as intracommunication within the circuit layers are essential. In other words, integrated circuits can be converted from a two dimensional plane-like structure into a three dimensional cube-like structure. The implementation of three dimensional communication would enable massive parallel data transfer and signal processing at all processing points in an array, thereby increasing the throughput and speed of system computation through elimination of the connection bottleneck.

The applications for three dimensional communication are numerous. For example, neural networks and, specifically, learning neural networks, would particularly benefit because of their array structure. See, for example, C. A. Mead, *Analog VLSI and Neural Systems*, Addison-Wesley, 1989, which is incorporated herein by reference, and which discloses the benefit of three dimensional communication to neural networks.

As another example, consider the benefit to an optical imaging array which converts light from an image into an electronic manifestation. The optical imaging array could be disposed on an outer plane of a three dimensional integrated circuit cube. The optical imaging array would benefit from three dimensional connection because each optical detector could then be connected directly to corresponding signal processing circuitry. As a result, (1) image arrays could be larger in area and in number of detectors; (2) extremely high throughput could be provided due to massive parallel processing; and (3) the ultimate number of array outputs could be reduced because of the pre-processing of each pixel data by corresponding processing circuitry.

In the art, three dimensional integration of circuitry has only begun to evolve. The preliminary research involving this type of integration is discussed hereafter.

A thermomigrated feedthrough technique is currently under development, but very little has been published in open literature about this technique. However, the thermomigrated feedthrough technique involves thermomigrating aluminum signal paths, or "feedthroughs," into a wafer to provide communication between the front and back side of a silicon (Si) wafer.

Because the aluminum is a p-type dopant and the surrounding Si wafer is an n-type dopant, a pn junction is created at the signal path interfaces. The pn junction isolates the thermomigrated feedthroughs from each other and thus prevents cross-talk. Furthermore, microbridge connections are used to connect separate wafers together. For more information on microbridge connections, see J. Little, R. Etchells, J. Grinberg, S. Laub, J. Nash, and M. Yung, *International Conference on Wafer Scale Integration Proceedings*, pp. 55-92, 1989, the disclosure of which is incorporated herein by reference.

Although the thermomigrated feedthrough technique has advantages, it remains problematic. First, most fabrication processes for complimentary metal oxide semiconductor (CMOS) devices use a p-type Si substrate wafer. The thermomigrated feedthrough technique can only use n-type wafers. Second, the pn junction isolation creates a large substrate capacitance for each feedthrough. This predicament capacitively loads the circuitry connected to the feedthroughs, thereby decreasing signal speed or requiring specialized high powered drive circuitry. In addition, the area occupied by the feedthrough I/O interconnect may be physically large because a small aluminum dot on the wafer surface will spread in area as well as in depth. Finally, the cost of the thermomigrated feedthrough technique may make it prohibitive for inexpensive integration.

Another three dimensional integration technique involves growing Si layers on top of insulating layers which have been deposited onto a Si wafer already having circuitry. Thus far, the research has focused on the recrystallization of the deposited Si, because the deposited Si tends to grow in amorphous form on the Si wafer. However, the heat generated in this growth and recrystallization technique, which often utilizes a laser to perform the recrystallization, is usually detrimental to the existing circuitry on the Si wafer situated below.

A flip chip technique for three dimensional integration involves the bonding of two wafers. This technique is described in *IEEE Transcript On Electronic Devices*, Volume 38, No. 5, Special Issue On Solid-State Image Sensors, 1991, which is incorporated herein by reference. This technique is undesirably limited to the connection of two layers of devices. In addition, flip chip bonding also suffers from yield and reliability problems.

Still another technique for three dimensional integration involves growing a photoconversion layer on top of Si circuitry. This technique is fully described by S. Manabe and Y. Mastunaga, *IEEE Transcript On Electronic Devices*, Volume 38, No. 8, pp. 1765-1771, 1991, the disclosure of which is incorporated herein by reference. The photoconversion layer integration technique is also an integration scheme which is limited to the connection of only two layers of devices. Furthermore, the photoconversion layer integration technique is extremely limited in device scope because only amorphous Si photoconversion layers can be used for the technique.

Yet another three dimensional integration technique involves multi-chip module technology. In this technique, individual chips are placed onto a highly interconnected substrate in a hybrid fashion to form a "multi-chip module." Complex interconnections between the chips are achieved by photolithographically-defined interconnects in the prefabricated substrate. At present, these multi-chip modules are finding some commercial application in computational systems such as computers. However, for computational systems having a very large number of processors, such as array processors, the technology is limited by the finite number of interconnections which can be achieved by the substrate.

Finally, three dimensional integration using optical interconnects has been proposed, but demonstrated only to a very limited extent in the art. For example, discrete light emitters and detectors, together with associated circuitry, have been crudely mounted on an insulating substrate, as described in R. K Kostuk, J. W. Goodman, and L. Hesselink, "Optical Imaging Applied to Microelectronic Chip-to-Chip Interconnections," *Appl. Opt.*, Vol. 24, p. 2851, 1985, incorporated herein by reference. Light emitters and detectors have also been formed on Si substrates, as discussed in M. J. Goodwin, A. J. Moseley, D. J. Robbins, M. Q. Kearley, J. Thompson, D. Clewitt, R. C. Goodfellow, and I. Bennion, "Hybridised Optoelectronic Modulator Arrays for Chip-to-Chip Optical Interconnection," *SPIE Proc.*, Vol. 1281, p. 207, 1990; A. Yariv, "The Beginning of Integrated Optoelectronic Circuits," *IEEE Trans. Electron Devices*, Vol. ED-31, p. 1656, 1984; and P. J. Ayliffe, J. W. Parker, and A. Robinson, "Comparison of Optical and Electrical Interconnections at the Board and Backplane Levels, ∞ *SPIE Proc.*, Vol. 1281, p.2, 1990, the disclosures of which are incorporated herein by reference.

A more notable attempt for optical integration was recently described in "Through-Wafer Optical Communication Using Monolithic InGaAs-on-Si LED's and Monolithic PtSi-Si Schottky-Barrier Detectors", G. W. Turner, C. K. Chen, B. Y. Tsaur, and A. M. Waxman, *IEEE Photonics Technology Letters*, Vol. 3, No. 8, August 1991, the disclosure of which is incorporated herein by reference. This technique involves communication through Si wafers by using a light emitter fabricated on one Si wafer and a detector fabricated on a second Si wafer. The emitter and detector are arranged in a stack configuration. The emitter is a doubleheterostructure InGaAs-InAlAs LED fabricated on a p-type Si substrate, and the detector is a PtSi Schottky-barrier diode fabricated on an n-type Si substrate.

Although the foregoing optical integration technique shows much promise in the area of three dimensional integration, it has severe limitations. Two Si wafers of different dopant type must be utilized. Moreover, growth of the emitter and detector on the Si wafers can cause damage to surrounding circuitry and/or limit the ability to fabricate certain circuitry within the proximity of the emitter and detector.

In essence, all optical integration techniques in the conventional art fall short of teaching a method for fabricating a fully operative and expansive three dimensional communication network within an integrated circuit.

SUMMARY OF THE INVENTION

The present invention provides for three dimensional integrated circuits and other applications via novel processes for monolithically integrating thin film semiconductor materials and devices, such as electromagnetic emitters and/or detectors. In essence, the novel processes involve lift-off of a thin film material from a growth substrate and alignable deposition of the thin film material onto a host substrate, as will be described in detail hereinafter.

In a monolithic three dimensional integrated circuit fabricated in accordance with the present invention, electromagnetic communication occurs vertically through any integrated circuit layer(s), which can have operational circuitry, and/or occurs laterally in the same integrated circuit layer. Electromagnetic signals are sent from an emitter and received by one or more detectors situated at some other location anywhere in the integrated circuit. In basic concept, the present invention is as follows. A first integrated circuit layer in the three dimensional integrated circuit has a first and a second side. An emitter situated either on the first side or on a layer spaced from the first integrated circuit layer sends electromagnetic signals towards the direction of the first side. The emitter can have an emitting junction, for example, created by $In_xGa_{1-x}As_yP_{1-y}$ materials (n-type coupled to p-type), where $0<x<1$ and $0<y<1$. The signals sent from the emitter pass through one or more layers because the layers are transparent to the carrier frequency of the signals. A detector is situated to receive the electromagnetic signals from the direction of the second side. The detector can be situated on the second side of the integrated circuit layer or on a different layer in the integrated circuit. Moreover, the detector can have a detecting junction, for example, that may be created by the materials used in the emitter. Worth noting is that the emitter and detector may be identical except for electrical excitation, and may be freely interchanged by changing electrical excitation so as to further increase the flexibility of the proposed invention. Finally, the foregoing emitters and detectors can be situated anywhere throughout an integrated circuit so as to provide for a very complex and flexible three dimensional communication network.

The present invention also provides for the fabrication of an array of optical detectors for an imaging or video system. The array of optical detectors is monolithically formed on an external surface of an integrated circuit. Each integrated layer has a polyimide or other electrically insulating layer with a top and a bottom and a hole therethrough leading to processing circuitry. The thin film detectors, placed on top of the polyimide or other electrically insulating layer, convert the optical signal to an electrical signal. The processing circuitry is configured to process the converted optical signals. The hole is filled with a conductor configured to transport the converted optical signals to the processing circuitry. The detectors can be made of an epitaxial layer comprised of either GaAs, InP or InGaAsP situated at the top of the polyimide layer in contact with the metal. The epitaxial layer alone can create a detecting junction, or the epitaxial layer in combination with the metal can create a detecting junction which receives optical signals from an exterior source and immediately transmits the signals to the processing circuitry.

The present invention overcomes the deficiencies of the prior art, as noted above, and further provides for the following additional features and advantages.

Electronic circuits at any position within a multilayered integrated circuit communicate vertically, in the third dimension. As a result, massively parallel processing is possible, thereby enhancing processing speed.

Massively parallel input/output (I/O) are provided by the present invention. Specifically, the number of I/O lines which can interface to an integrated circuit is substantially enhanced, because I/O contacts can be placed not only around the sides of the integrated circuit, but also on the top and bottom. These I/O can be very fast, optical I/O as well. In essence, integrated circuit "cubes" are constructed.

Electronic circuits can be designed to occupy less space due to the enhanced interconnection network.

Three dimensional communication networks can be implemented in integrated circuits fabricated from inexpensive Si and/or GaAs wafers. In other words, integrated circuits are first fabricated in an inexpensive manner using conventional Si or GaAs foundries. Then, the optical emitters and detectors are attached to the foundry Si or GaAs circuits in post-processing steps.

A corollary to the foregoing advantage is that the Si or GaAs circuitry and the emitters/detectors can be independently optimized and/or tested before integration for high yield and high performance.

The present invention provides for extensive image processing and video applications. Optical detectors fabricated from semiconductor materials, such as GaAs, InP or InGaAsP based materials, can be integrated directly on top of an existing Si, GaAs or Si substrate. Further, the Si substrate could have processing circuitry for processing signals received by individual optical detectors or aggregates thereof.

In accordance with another feature envisioned by the present invention, an optical device can be used as both an emitter and a detector (transceiver). Hence, two way communication can occur with only two optical devices.

Many communications wavelengths for the emitter/detector pair are envisioned. Furthermore, with the addition of modulation techniques, the number of communication channels is virtually infinite.

Further features and advantages of the present invention will become apparent to one skilled in the art upon examination of the following drawings and the detailed description. It is intended that any additional features and advantages be incorporated herein.

BRIEF DESCRIPTION OF THE DRAWINGS

The present invention, as defined in the claims, can be better understood with reference to the following drawings.

FIGS. 2A through 2C show examples of various diode configuration which are usable as emitters and detectors within the three dimensional integrated circuit of FIG. 1;

FIGS. 3A through, 3G illustrate a first epitaxial lift-off and deposition process for electromagnetic communication devices wherein a carrier layer is utilized to lift-off and protect device layers;

FIGS. 4A through 4G illustrate a second epitaxial lift-off and deposition process for electromagnetic communication devices wherein a transfer medium is utilized to invert device layers;

FIGS. 7A through 7G illustrate a third epitaxial lift-off and deposition process for producing optical detectors shown in FIGS. 5 and 6.

DETAILED DESCRIPTION OF THE PREFERRED EMBODIMENTS

I. Three Dimensional Integrated Circuits

Figure 1:
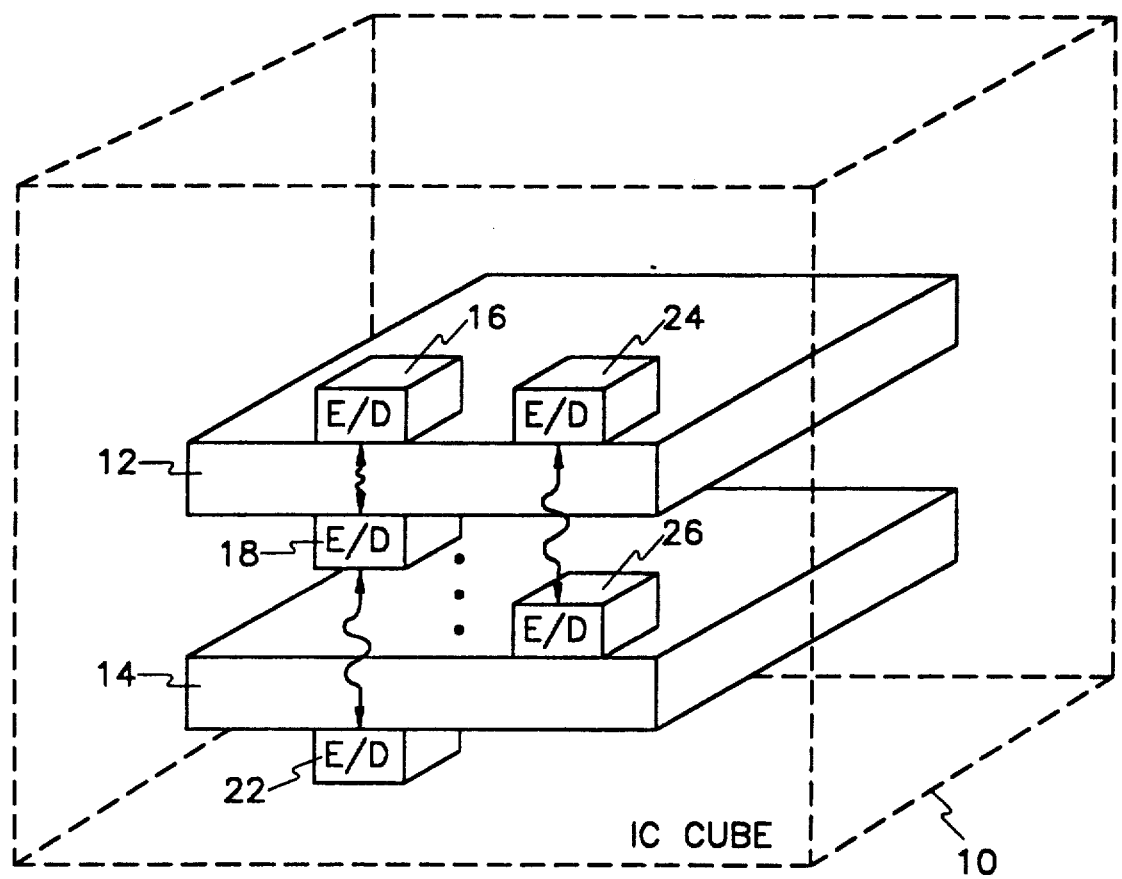
FIG. 1 illustrates vertical intercommunication between layers of a three dimensional integrated circuit wherein an emitter (E) sends signals to a detector (D) through an integrated circuit layer(s)

FIG. 1 illustrates a multilayered integrated circuit (IC) 10 wherein vertical communication occurs through one or more integrated circuit layers 12, 14. Although not shown for simplicity, the integrated circuit 10 can have numerous layers, and the principles described herein are equally applicable. Referring to FIG. 1, vertical communication in combination with the planar communication occurring within integrated circuit layers 12, 14 results in complete three dimensional communication within the integrated circuit 10. Hence, the integrated circuit 10 can be characterized as an integrated circuit "cube."

Integrated circuit layers communicate via electromagnetic signals which can pass unhindered through the layers due to their wavelength. If layers 12, 14 are fabricated from Si, then the electromagnetic signals must have a wavelength greater than 1.12 micrometers ($\mu$m) in order for the Si to be transparent to the electromagnetic signals. If the layers 12, 14 are GaAs, then the wavelength must be greater than 0.85 $\mu$m to establish transparency of the electromagnetic signals. However, many communications wavelengths are possible depending upon the chemical composition of the layers 12, 14. Furthermore, with the implementation of modulation techniques, the number of potential communication channels is virtually infinite.

As further shown in FIG. 1, electromagnetic communication devices are positioned throughout the integrated circuit 10 to permit vertical communication among and through IC layers. An emitter (E) 16 can communicate through layer 12 to a detector (D) 18. The emitter 16 can communicate through both layers 12, 14 to a detector 22. Moreover, the emitter 16 can communicate simultaneously to both detectors 18, 22, if desired.

The electromagnetic communication devices can also be switched so as to operate as both emitters and detectors, or as transceivers (E/D). For instance, as illustrated in FIG. 1, electromagnetic communication devices 24, 26 can operate as both emitters and detectors through the layer 12. Hence, an infinite number of communication configurations are envisioned.

FIGS. 2A through 2C show various electromagnetic communication devices which can be used to effectuate the vertical electromagnetic communication channels of FIG. 1. FIGS. 2A through 2C illustrate diode configurations, which are well known in the art. See *Physics of Semiconductor Devices*, by S. M. Sze (1981), which is incorporated by reference as if set forth in full hereinbelow.

FIG. 2A shows a metal-semiconductor-metal (MSM) diode configuration. $In_xGa_{1-x}As_yP_{1-y}$ materials (n-type or p-type), where $0<x<1$ and $0<y<1$, are coupled to a metal, such as gold, silver, copper, aluminum, or the like. FIGS. 2B shows another semiconductor diode configuration which can be used to transmit and receive electromagnetic signals. An n-type $In_xGa_{1-x}As_yP_{1-y}$ material, where $0<x<1$ and $0<y<1$, is coupled to a p-type $In_{x'}Ga_{1-x'}As_{y'}P_{1-y'}$ material, where $0<x'<1$ and $0<y'<1$.

Although communication using diode configurations is well known in the art and is not the primary focus of the present invention, a brief discussion follows for a better understanding the merits of the present invention. Essentially, electromagnetic signals are created and detected by electrical biasing of the junction which is formed by the two materials adjoined in each of the diode configurations.

Communication using the diode configurations is initiated as follows. The diode configuration is first biased with a voltage. Propagation or reception depends, in large part, upon the device design and direction of voltage biasing. The diode configurations of FIG. 2A through 2C will send and receive electromagnetic signals having wavelengths between 1.3 and 1.55 microns, which is well above the Si and GaAs transparency wavelength thresholds of 1.12 and 0.85 microns, respectively. Note that communication is possible using different emitter and detector types, depending upon the materials utilized in the configuration.

It is further envisioned that multiple quantum well (MQW) reflective electroabsorption light modulators, surface emitting lasers (SELs), and vertical cavity surface emitting lasers (VCSELs) developed from GaAs and InP based materials, including $In_x$, $Ga_{1-x}$, where $0<x<1$ and $0<y<1$, can be employed to propagate and/or modulate more efficiently signals in the three dimensional integrated circuit of FIG. 1. These devices cause less heating problems and can switch much faster than diode configurations. Detailed discussions regarding SELs and VCSELs can be found in *IEEE Journ. Quant. Elect.*, Vol. 64, No. 6, Special Issue on Semiconductor Lasers, 1991, and J. Jewell, J. Harbison, A. Scherer, Y. Lee and L. Florez, *IEEE Journal Quant. Elect.*, Volume 7, No. 6, pp. 1332–1346, the disclosures of which both are incorporated herein by reference.

FIGS. 3 and 4 show processes for fabricating and depositing device configurations as shown and described in relation to FIGS. 2A through 2C. The deposition of $In_x$, $Ga_{1-x}$, $As_y$, $P_{1-y}$ based materials and devices onto host substrates is a key element to the realization of the diode and laser configurations, and more generally, to the realization of three dimensional communication in accordance with the present invention.

To provide for the deposition of InGaAsP based materials in order to build three dimensional IC cubes, the inventors have developed several advanced epitaxial lift-off processes discussed hereafter. These processes provide for lifting-off thin film semiconductors having a thickness of typically less than 20 micrometers.

II. First Epitaxial Lift-Off And Deposition Process

FIGS. 3A through 3G illustrate a first epitaxial lift-off and alignable deposition process wherein a carrier layer is utilized to lift off and protect device layers. With reference to FIG. 3A, a growth substrate 62 is provided with a sacrificial layer 64 and an epitaxial layer 66. The sacrificial layer 64 and epitaxial layer 66 are deposited on the growth substrate 62 using any conventional technique. "Depositing" in the context of this document refers to growing a substance on another or any other mechanism for disposing a substance on another.

In the preferred embodiment, the growth substrate 62 is GaAs. The sacrificial layer 64 is a thin layer of aluminum gallium arsenide $Al_xGA_{1-x}As$, where $0.6 \leq x \leq 1.0$. Moreover, the epitaxial layers 66 comprise GaAs-based compounds. For example, the epitaxial layers 66 can comprise $Al_xGa_{1-x}As$ with a composition range of $0<x<1.0$.

Mesa etch processing is then used to define device layers 68 from the epitaxial layer 66. The mesa etch uses, for example, a photoresist mask and is performed using, for instance, $H_2SO_4:H_2O(1:8:160)$ as a fast gross etch with a final selective etch of $NH_4OH:H_2O_2(1:200)$ which stops at the AlAs sacrificial layer 64.

FIG. 3C shows that other processing steps, such as contact definition, can occur on the device layers 68 either before or after the mesa etch. As shown in FIG. 3C, metal contacts or dielectric layers 72 can be deposited on the device layers 68. Deposition of these layers 72 can occur using any of numerous conventional techniques. In the preferred embodiment, metal contacts 72 are bonded to the device layers 68 via vacuum deposition.

The device layers 68 with metal contacts 72, if applicable, are completely coated with a carrier layer 74. In the preferred embodiment, the carrier layer 74 is either a transparent polyimide or other organic material which itself can be made to act as a release layer. Apiezon W, which is essentially a black, opaque wax, can also be utilized as described in U.S. Pat. No. 4,846,931 to Gmitter et al. of Bellcore, the disclosure of which is incorporated herein by reference. Furthermore, it is also possible that the carrier layer 74 could be a metal, which has been evaporated, sputtered, and/or plated over the device layers 68. However, use of a transparent polyimide is preferred for several reasons. Because of its transparency, device layers 68 can be viewed while encapsulated and therefore aligned as will be further discussed hereinafter. Moreover, polyimides exhibit the desirable mechanical property of being under residual tensile stress at room temperature. See Allen, M. G., Mehregany, M., Howe, R. T., and Senturia, S. D., "Microfabricated Structures for the InSitu Measurement of Residual Stress, Young's Modulus, and Ultimate Strain of Thin Films," *Applied Physics Letters*, Volume 51, No. 4, pp. 241-244, 1987 incorporated herein by reference. Finally, the thermal properties of polyimides are excellent. Temperatures in excess of 400° C. can be maintained without damage to the polyimide or device layers 68 protected thereby.

Next, as shown in FIG. 3E, the sacrificial layer 64 is etched away using a standard $HF:H_2O$ (1:10) etch solution to separate the device layers 68 and surrounding carrier layer 74 from the growth substrate 62, as shown in FIG. 1E. In accordance with a significant aspect of the present invention, metal layers (e.g., Al) or $Al_x$-$Ga_{1-x}As$ layers where $x>0.4$ can be included in the device layers 68, because the device layers 68 are protected on their sides from the etch solution $HF:H_2O$ (1:10) by layer 74. For a further discussion, see I. Pollentier, L. Buydens, P. Van Daele, P. Demeester, "Fabrication of GaAs—AlGaAs GRIN—SCH SQW Laser Diode on Silicon by Epitaxial Lift-Off," *IEEE Phot. Tech. Lett.*, 3, 2, pp. 115-117, 1991, the disclosure of which is incorporated herein by reference.

After the combination of the device layers 68 and carrier layer 74 has been etched away from the substrate 62, the combination can easily be handled and transported.

The device layers 68 are next placed in contact with a host substrate 84, as shown in FIG. 3F. If the carrier layer 74 is a transparent polymer, alignment of the device layers 68 with particular circuitry on the host substrate 84 is easily accomplished.

The devices are adhered to the host substrate by a variety of methods, including van der Waals bonding and metal-metal annealing.

After the device layers 68 have been aligned and positioned over desired locations on top of the host substrate 84, the carrier layer 74 is dissociated from the device layers 68. The dissociation can be effectuated using many techniques.

For example, the bond between device layers 68 and the carrier layer 74 can be broken by the following well known methods: (1) thermally, for example, through spot heating or through local application of high-intensity laser light, (2) photolytically through local exposure to shortwavelength laser light, (3) photochemically through local exposure to short-wavelength laser light in the presence of a reactive gas, or (4) chemically by etching or dissolution. After dissociation, the device layers 68 are in contact with the desired locations on the host substrate 84, as indicated in FIG. 3G.

Preferably, the operation in FIG. 3G is performed within a clean room. Moreover, the host substrate 84 can comprise a Si or GaAs circuit which has been developed and optimized in a foundry independent of the device layers 68.

An oven-annealing step may be desirable at this point to further consolidate and strengthen the bonds between the device layers 68 and the host substrate 84. Furthermore, a whole-wafer cleaning might also be carried out to remove any residual carrier layer material.

Another aspect of the first epitaxial lift-off and deposition technique is that a peripheral frame (not shown) can be bonded to the carrier layer 74 before the growth substrate 62 is freed. The peripheral frame can help in handling and aligning the device layers 68. The assembly would resemble a mounted pellicle after release from the growth substrate 62.

III. Second Epitaxial Lift-Off And Deposition Technique

FIGS. 4A through 4G illustrate a second epitaxial lift-off and alignable deposition process for fabricating electromagnetic communication devices wherein a transfer medium is utilized to invert the device layers 68.

The second epitaxial lift-off and deposition technique of FIG. 4 proceeds as the first technique shown in FIG. 3. Steps 3A-3E of FIG. 3 are identical to steps 4A-4E of FIG. 4. However, at the step shown in FIG. 4F, the second epitaxial lift-off and deposition technique calls for placing the freely maneuverable combination of the device layer 68 and the carrier layer 74 onto a transfer medium, which in the preferred embodiment, is a diaphragm assembly 76 comprising a diaphragm 78 and support ring 82. The diaphragm assembly 76 is a drum-like structure fabricated using any standard micromachining techniques.

In the preferred embodiment, the diaphragm assembly 76 is formed by first coating a Si wafer with approximately 4 microns of a transparent polyimide. The transparent polyimide is spin cast from a commercially available polymeric acid solution (DuPont PI 2611) which is baked at 150° C. in air for 30 minutes and cured at 400° C. in nitrogen for 1 hour. After the Si wafer has been coated with the polyimide, the central portion of the Si wafer is etched from the backside using a $HF:HNO_3:H_2O$ etchant using a single-sided etching technique. A single-sided etching technique for this purpose is disclosed in J. Y. Pan and S. D. Senturia, "Suspended Membrane Methods for Determining the Effects of Humidity on the Mechanical Properties of Thin Polymer Films," *Society of Plastics Engineers Technical Papers: ANTEC '91*, Volume 37, pp. 1618-1621, May, 1991, the disclosure of which is incorporated herein by reference. The etching process results in the diaphragm assembly 76 having a polymeric diaphragm 78, which measures approximately 4 μm thick and 3-25 millimeters (mm) in diameter, and which is supported by a Si ring 82. The polymeric diaphragm 78 is transparent, taut, and mechanically tough. Thus, the polymeric diaphragm 78 is ideal as a carrier for the device layers 68.

Optionally, a low power oxygen plasma etch is performed on the diaphragm 78 prior to deposition of the device layers 68. The oxygen plasma etch enhances the adhesion of the device layers 68 to the diaphragm 78.

Next, the carrier layer 74 is dissolved while affixed to the diaphragm assembly 76. In the preferred embodiment, trichloroethylene is used to dissolve the Apiezon. As a result, the device layers 68 are left alone bonded to the top of the polymeric diaphragm 78. Note that the pre-liftoff processing materials, for example, the metal contacts 72, now reside on the top of the device layers 68 supported by the polymeric diaphragm 78.

As shown in FIG. 4G, the device layers 68 can now be aligned through the transparent polymeric diaphragm 78 and selectively deposited onto a host substrate 84. Note that a single device can be selectively deposited from a device array, or alternatively, an entire array of devices can be deposited. Note also that larger arrays of deposited devices can be fabricated by aligning and depositing subarrays of devices. Preferably, the process shown in FIG. 4G is performed within a clean room. Moreover, the host substrate 84 can comprise a circuit containing a Si or a GaAs substrate which has been developed in a foundry independent from the device layers 68.

The deposition of the device layers 68 onto the host substrate 84 can be effectuated via many techniques. All deposition techniques described in regard to the first lift-off and deposition technique of FIGS. 3A through 3G can be utilized in the second lift-off and deposition technique of FIG. 4. In addition, the polymeric diaphragm 78 can be etched away around the device layers 68 so as to release the device layers 68 onto the host substrate 84. Furthermore, it is envisioned that the polymeric diaphragm 78 could be fabricated in a web-like manner so as to facilitate tearing and deposition of the device layers 68. To further enhance the alignment of device layers 68, the diaphragm assembly 76 may be placed in a mask aligner. With the diaphragm assembly 76 in a mask aligner, the device layers 68 can be positioned on the host substrate 84 with a high precision (at least to within 1 μm).

Another aspect of the second lift-off and deposition technique is that the device layers 68 with metal contact 72 can be deposited directly onto another metal contact 86 situated at the top surface of the host substrate 84. The metal contact 72 and the metal contact 86 form a much better electrical bond than merely a van der Waals bond, generally because of the surface characteristics of metals. Additionally, the metal contact 72 and the metal contact 86 can be fused together via a heating process so as to further enhance the electrical characteristics of the connection.

The foregoing second lift-off process also allows layers of other materials such as metals to be deposited onto both sides of the thin film lift-off layer while the lift off layer is being supported by a substrate, thereby providing mechanical support to the lift-off layer while the potentially stress and/or strain producing layers are deposited onto the lift-off layers.

IV. Optical Detector Array For Imaging Systems

Figure 5:
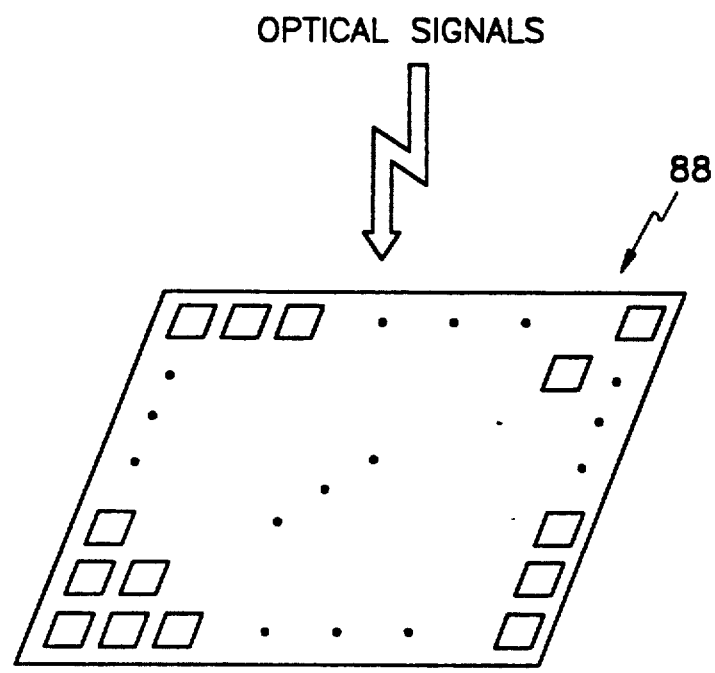
FIG. 5 shows an array of optical detectors configured to receive optical signals.

For image processing and other video applications, an array of optical detectors 88, illustrated in FIG. 5, can be deposited onto a suitable substrate in accordance with the methods of the present invention. Such an array would have many advantages.

The optical detectors 88 can be configured to receive simultaneously optical signals from, for example, an image or a video projection device. The optical signals are then processed massively in parallel so as to gain a substantial speed advantage in processing, and consequently, real time evaluation of the image.

Figure 6:
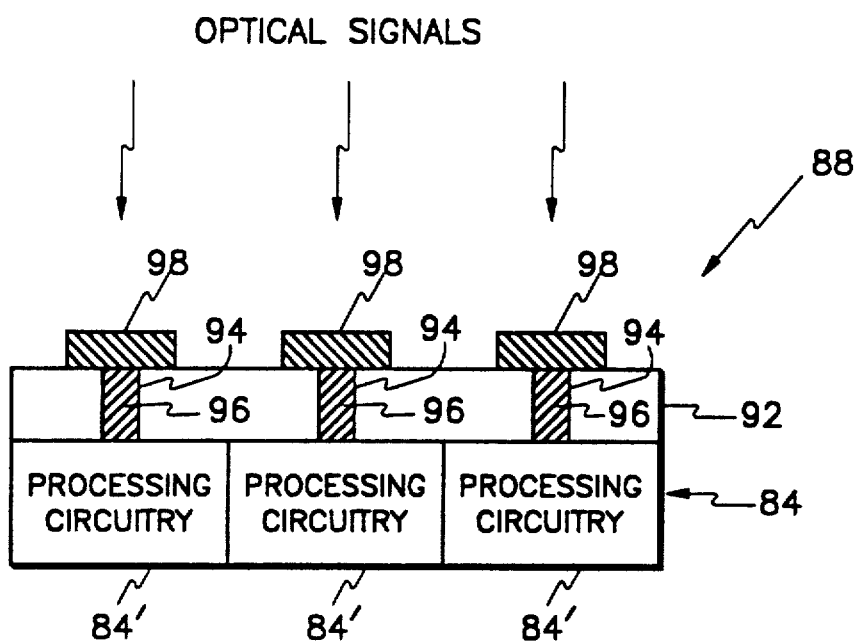
FIG. 6 is a cross section of the optical detector array of FIG. 5.

FIG. 6 shows a cross-section of a possible optical array configuration and related circuitry. Preferably, the array is fabricated by first applying an insulating layer such as a polyimide layer 92 on the host substrate 84, which has optical signal processing circuitry. The host substrate 84 can be Si or GaAs. Moreover, the polyimide layer 72 can be 1-4 microns in thickness. Next, holes 94 are cut into the polyimide layer 92. The holes 94 are then filled or partially filled with metals or metal alloys 96 such that an electrical connection is made, such as gold (Au). Finally, a thin film semiconductor layer 98, such as $In_xGa_{1-x}As_yP_{1-y}$ is deposited onto the metal 96 using one of the lift-off and deposition techniques disclosed herein.

The metal 96 can serve the purpose of both creating a MSM diode configuration, as shown in FIG. 2A, and communicating signals to the processing circuitry within the host substrate 84. Alternatively, a junction detector (FIG. 2B) can be connected by metal to the processing circuitry. Because the metal interconnects 94 are extremely short, for example, 1-2 microns, virtually no parasitic capacitance will hinder the speed of the optical detectors.

Each of the detectors can be allocated its own processing circuitry 84', as further shown in FIG. 6. The processing circuitry 84' can directly and immediately process optical signals.

A neural network can be situated in the host substrate 84. In other similar embodiments, the data could be partially processed by the host substrate 84, and then the optical signal data could be sent to a neural network or another substrate.

Processing circuitry also could be configured in hierarchical layers. In other words, another layer of processing circuitry could integrate the results of the processing circuitry 84'.

V. Third Epitaxial Lift-Off And Deposition Technique

The optical detectors 88 described in relation to FIGS. 5 and 6 can be produced by using the techniques illustrated in FIGS. 3 and 4. However, in addition, the inventors have developed a third epitaxial lift-off and alignable deposition process for depositing an array of $In_xGa_{1-x}As_yP_{1-y}$.

The third epitaxial lift-off and deposition technique will be described with regard to FIG. 7. The steps of the process shown in FIGS. 7A-7C are substantially similar to the steps shown and described with respect to steps A-D in FIGS. 3 and 4. However, in the process of FIG. 7, the growth substrate 62 is InP, the sacrificial layer 64 is $In_xGa_{1-x}As_yP_{1-y}$ material, where $0<x<1$ and $0<y<1$, and the device layers 98 are $In_xGa_{1-x}As_yP_{1-y}$ material, where $0<x<1$ and $0<y<1$.

After the carrier layer 74 has been applied in order to encapsulate the device layers 22 on the growth substrate 62, the InP growth substrate 62 is etched away with a first etch solution. In the preferred embodiment, the first etch solution can be, for example, $HCl:H_3PO_4$ (3:1). The first etch solution does not affect the InGaAsP sacrificial layer 64, as shown in FIG. 7D. The InGaAsP sacrificial layer 64 can be used with the device layers 94 as part of the emitting and/or detecting device. Alternatively, a second etch solution, which can be, for example, $HF:H_2O_2:H_2O$ (1:1:10) or $H_2SO_4:H_2O_2:H_2O$ (1:1:1) in the preferred embodiment, can be applied to eliminate the InGaAsP sacrificial layer 64, as illustrated in FIG. 7E. Metals and/or dielectric layers can be deposited onto both sides of the epitaxial devices as outlined in FIG. 4.

At this point, the semiconductor layers 98 can be selectively aligned and positioned onto the host substrate 84, as illustrated in FIG. 3, depending upon the desired ultimate configuration of the device layers 98. In the alternative, as shown in FIG. 7F and 7G, the diaphragm assembly 76 can be used to invert the semiconductor layers 98 before deposition onto the host substrate 84.

Those persons skilled in the art will readily appreciate the many modifications that are possible without materially departing from the novel teachings of the present invention. Accordingly, all such modifications are intended to be included within the scope of the present invention.

Wherefore, the following inventions are claimed:

1. A monolithic multilayered integrated circuit, comprising a thin film semiconductor emitter means for sending electromagnetic signals encoded with information to a said monolithic multilayered integrated circuit, said detector means being formed separately from said monolithic multilayered integrated circuit and being subsequently deposited in said circuit.

2. A monolithic multilayered integrated circuit, comprising:
   a first substrate having a first and a second side;
   an emitter situated to send electromagnetic signals towards the direction of said first side, said emitter being formed on a growth substrate which is separate from said integrated circuit and subsequently deposited onto a host substrate in said integrated circuit; and
   a detector situated to receive said electromagnetic signals from the direction of said second side.

3. The circuit of claim 2, wherein said emitter comprises an emitting junction.

4. The circuit of claim 2, wherein said detector comprises a detecting junction.

5. The circuit of claim 2, wherein said host substrate comprises Si.

6. The circuit of claim 2, wherein said emitter comprises a thin film semiconductor having a thickness less than 20 micrometers.

7. The circuit of claim 2, wherein said detector comprises a thin film device having a thickness less than 20 micrometers.

8. The circuit of claim 2, further comprising a second monolithic multilayered integrated circuit having a second detector and wherein said emitter in said first circuit communicates with said second detector in said second monolithic multilayered integrated circuit.

9. The circuit of claim 2, wherein said emitter comprises a thin film single crystal semiconductor having a thickness less than 20 micrometers.

10. The circuit of claim 3, wherein said emitter comprises $In_xGa_{1-x}As_yP_{1-y}$ semiconductor material where $0<x<1$ and $0<y<1$ and wherein said host substrate comprises silicon.

11. The circuit of claim 4, wherein said detector comprises $In_xGa_{1-x}As_yP_{1-y}$ semiconductor material where $0<x<1$ and $0<y<1$ and wherein said host substrate comprises silicon.

12. The circuit of claim 10, wherein said $In_xGa_{1-x}As_yP_{1-y}$ semiconductor material is coupled to metal so as to create said emitting junction.

13. The circuit of claim 11, wherein said $In_xGa_{1-x}As_yP_{1-y}$ semiconductor material is coupled to metal so as to create said detecting junction.

14. A monolithic multilayered integrated circuit, comprising:
   a first layer having a top and a bottom and an electrical connection therethrough to connect said top to a substrate at said bottom; and
   a thin film semiconductor layer situated at said top in connection with said electrical connection, said thin film semiconductor layer being formed on a growth substrate separately from said first layer and subsequently deposited onto said first layer.

15. The circuit of claim 14, wherein said thin film semiconductor layer comprises a single crystal.

16. The circuit of claim 14, wherein said thin film semiconductor layer measures less than 20 micrometers in thickness.

17. The circuit of claim 14, wherein said electrical connection comprises metal.

18. The circuit of claim 14, wherein said thin film semiconductor layer comprises $In_xGa_{1-x}As_yP_{1-y}$ semiconductor material where $0<x<1$ and $0<y<1$.

19. The circuit of claim 14, wherein said first layer comprises polyimide.

20. An optical detector for an integrated circuit in an imaging system, comprising:
   a first layer having a top and a bottom and a metal electrical connection therethrough to a substrate with processing circuitry configured to process electrical signals; and
   a thin film semiconductor layer situated at said top and connected to said metal electrical connection, said thin film semiconductor layer in combination with said metal electrical connection configured to receive said optical signals from an exterior source and convert said optical signals into electrical signals, said thin film semiconductor layer being formed on a growth substrate independently of said first layer and being subsequently deposited onto said first layer.

21. The circuit of claim 1, further comprising a monolithically integrated thin film semiconductor detector means and wherein said electromagnetic signals pass through a substrate to said thin film detector means, said thin film detector means being formed separately from said monolithic multilayered integrated circuit and being subsequently deposited in said circuit.

22. A monolithic multilayered integrated circuit comprising a thin film semiconductor detector means for receiving electromagnetic signals encoded with information form an emitter means situated remote from said monolithic multilayered integrated circuit, said detector means being formed separately from said monolithic multilayered integrated circuit and being subsequently deposited in said circuit.

23. A monolithic multilayered integrated circuit, comprising:
   a first substrate having a first and a second side;
   an emitter situated to send electromagnetic signals towards the direction of said first side; and
   a detector situated to receive said electromagnetic signals from the direction of said second side, said detector being formed on a growth substrate which is separate from said integrated circuit and subsequently deposited on a host substrate in said integrated circuit.

24. The circuit of claim 23, wherein said detector comprises a detecting junction.

25. The circuit of claim 23, wherein said substrate comprised silicon.

26. The circuit of claim 23, wherein said detector comprises a thin film semiconductor having a thickness less than 20 micrometers.

27. The circuit of claim 23, wherein said emitter comprises a thin film semiconductor having a thickness less than 20 micrometers.

28. The circuit of claim 23, wherein said emitter comprises a thin film single crystal semiconductor having a thickness less than 20 micrometers.

29. The circuit of claim 23, wherein said detector comprises a thin film single crystal semiconductor having a thickness less than 20 micrometers.

30. The circuit of claim 23, wherein said detector comprises $In_xGa_{1-x}As_yP_{1-y}$ semiconductor material, where $0<x<1$ and $0<y<1$, and wherein said host substrate comprises silicon.

31. The circuit of claim 30, wherein said emitter comprises $In_xGa_{1-x}As_yP_{1-y}$ semiconductor material, where $0<x<1$ and $0<y<1$, and wherein said host substrate comprises silicon.

32. A monolithic multilayered integrated circuit, comprising:
   a first substrate having a first side and a second side;
   an emitter situated to send electromagnetic signals towards the direction of said first side;
   a detector situated to receive said electromagnetic signals from the direction of said second side;
   wherein said emitter and said detector are created on another separate substrate, independently of said integrated circuit, and are then deposited on a host substrate in said integrated circuit.

33. The circuit of claim 32, wherein said emitter is created and deposited on said host substrate by the following steps:
   depositing a thin film epitaxial layer on a sacrificial layer situated on a growth substrate;
   defining said emitter in said epitaxial layer;
   coating said emitter with a carrier layer;
   removing said sacrificial layer to release the combination of said emitter and said carrier layer from said growth substrate;
   positioning said emitter on a transfer medium;
   removing said carrier layer; and
   depositing said emitter on said host substrate from said transfer medium.

34. The circuit of claim 32, wherein said detector is created and deposited on said host substrate by the following steps:
   depositing a thin film epitaxial layer on a sacrificial layer situated on a growth substrate;
   defining said detector in said epitaxial layer;
   coating said detector with a carrier layer;
   removing said sacrificial layer to release the combination of said detector and said carrier layer from said growth substrate;
   positioning said detector on a transfer medium;
   removing said carrier layer; and
   depositing said detector onto said host substrate from said transfer medium.

35. A monolithic multilayered integrated circuit, comprising:
   a first layer having a top and a bottom and an electrical connection therethrough to connect said top to a substrate at said bottom;
   a thin film semiconductor layer situated at said top in connection with said electrical connection;
   wherein said thin film semiconductor layer is formed and deposited on said first layer by the following steps:
      forming said semiconductor layer on a sacrificial layer situated on a growth substrate;
      coating said semiconductor layer with a carrier layer;
      etching away said growth substrate;
      etching away said sacrificial layer;
      positioning said semiconductor layer against a transfer medium;
      removing said carrier layer; and
      depositing said semiconductor layer on said first layer from said transfer medium.

36. An optical detector for an integrated circuit in an imaging system, comprising:
   a first layer having a top and a bottom and a metal electrical connection therethrough to a substrate with processing circuitry configured to process electrical signals;
   a thin film semiconductor layer situated at said top and connected to said metal electrical connection, said thin film semiconductor layer in combination with said metal electrical connection configured to receive said optical signals from an exterior source and convert said optical signals into electrical signals; and
   said thin film semiconductor layer being independently formed from said first layer and then deposited on said first layer by the following steps;
      forming said thin film semiconductor layer on a sacrificial layer situated on a growth substrate;
      coating said semiconductor layer with a carrier layer;
      etching away said growth substrate;
      etching away said sacrificial layer;
      positioning said semiconductor layer against a transfer medium;
      removing said carrier layer; and
      depositing said semiconductor layer on said first layer from said transfer medium.

* * * * *

UNITED STATES PATENT AND TRADEMARK OFFICE
CERTIFICATE OF CORRECTION

PATENT NO. : 5,280,184
DATED : January 18, 1994
INVENTOR(S) : Jokerst et al.

It is certified that error appears in the above-indentified patent and that said Letters Patent is hereby corrected as shown below:

Column 4, line 24, delete "∞" and replace with --"--.

Column 8, line 37, delete ":" before "P" and delete "," after "$P_1-y$".

Column 13, line 39, after "a" insert --detector means situated remote from--.

Signed and Sealed this

Fourteenth Day of March, 1995

Attest:

BRUCE LEHMAN

*Attesting Officer*    *Commissioner of Patents and Trademarks*

UNITED STATES PATENT AND TRADEMARK OFFICE
CERTIFICATE OF CORRECTION

PATENT NO. : 5,280,184
DATED : January 18, 1994
INVENTOR(S) : Jokerst et al.

It is certified that error appears in the above-identified patent and that said Letters Patent is hereby corrected as shown below:

<u>Column 13,</u>
Lines 36-42, please replace claim 1 with the following:

-- 1. A monolithic multilayered integrated circuit, comprising a thin film semiconductor emitter means for sending electromagnetic signals encoded with information to a detector means situated remote from said monolithic multilayered integrated circuit, said detector means for receiving said electromagnetic signals, said emitter means being formed seperatly from said monolithic multilayered integrated circuit and being subsequently deposited in said circuit. --

<u>Column 14,</u>
Line 68, replace the word "form" with -- from --.

Signed and Sealed this

Thirteenth Day of April, 2004

JON W. DUDAS
*Acting Director of the United States Patent and Trademark Office*